United States Patent [19]

Cagnin et al.

[11] Patent Number: 5,011,761
[45] Date of Patent: Apr. 30, 1991

[54] PROCESS FOR MAKING METALLIZED HOLES IN A DIELECTRIC SUBSTRATE BY VACUUM DEPOSITION OF METALS AND THE PRODUCT OBTAINED THEREBY

[75] Inventors: Tarcisio Cagnin, Milan; Giampiero Ferraris, Como, both of Italy

[73] Assignee: Siemens Telecommunicazioni S.p.A., Milan, Italy

[21] Appl. No.: 316,365

[22] Filed: Feb. 27, 1989

[30] Foreign Application Priority Data

Mar. 18, 1988 [IT] Italy .................. 19830 A/88

[51] Int. Cl.⁵ .................... G03C 5/00; C25D 5/02
[52] U.S. Cl. .................... 430/312; 430/314; 430/313; 430/315; 430/319; 430/329; 204/15
[58] Field of Search ............. 430/312, 313, 314, 315, 430/319, 329; 204/15

[56] References Cited

U.S. PATENT DOCUMENTS 4,226,932 10/1980 Ferraris .................. 430/312

OTHER PUBLICATIONS

Robert J. Thompson and Bradley W. Whitaker, "Conductive Via Processing Utilizing RF Sputtering and Selective Electrodeposition for Hybrid Thin Film Circuits"; Hewlett Packard Company (1982); pp. 536-542.

*Primary Examiner*—Charles L. Bowers, Jr.
*Assistant Examiner*—Ashley I. Pezzner
*Attorney, Agent, or Firm*—Adel A. Ahmed

[57] ABSTRACT

A process for making metallized holes in a dielectric substrate which, after galvanic growth of the conductive paths delimited by photoresist on the substrate, includes a drilling step of the substrate and electrogalvanic creation of rivets protruding beyond the edges of the holes on the front of the substrate. The steps of completion of the conductive and resistive paths on the front, deposition of metals on the back, reinforcement of the rivets and galvanic growth of the back and of the metals deposited inside the hole then follow.

14 Claims, 3 Drawing Sheets

PROCESS FOR MAKING METALLIZED HOLES IN A DIELECTRIC SUBSTRATE BY VACUUM DEPOSITION OF METALS AND THE PRODUCT OBTAINED THEREBY

BACKGROUND OF THE INVENTION

1. Field of the Invention

The present invention relates to a process for making conducting connections in dielectric substrates by vacuum deposition of metals on the surface of and inside the through holes and the product obtained thereby, especially for application in hybrid integrated thin film circuits.

2. Description of the Prior Art

To make low-resistance electrical connections between the two sides of a dielectric substrate of a hybrid microelectronic thin film circuit it is known to use as connection paths holes made at certain points of the substrate and to coat the vertical walls of the holes with layers of metal connected to the circuit elements on the two sides of the substrate.

In this manner connection is assured in an integrated and economical manner. The length of the connection between the two sides is reduced to the minimum so that the components welded on one side of the substrate, hereinafter called the front, are connected to the other side, hereinafter called the back, by the shortest possible path.

The technique of conductive coating of the side walls of the holes is certainly simpler and more economical to perform industrially than the conventional technique which calls for making each individual connection with wires or metal strips inserted in the holes and welded to the two sides of the substrate.

The main problem is to establish how and in what phase of the hybrid thin film circuit production process to perform the operations creating the metallized holes.

The most obvious and widely used known method is to drill the substrate at the beginning of processing, i.e. when no metal deposits of any kind are present on the substrate. In this manner the metal layers deposited subsequently on both sides of the substrate also cover the walls of the holes already made.

The main drawbacks of this known method are the following. Once the substrates are drilled they can be used only for a specific type of circuit, i.e. requiring holes in those positions. Some equipment used in the fabrication of the hybrid thin film circuits uses the technique of suction and creation of vacuum to hold the substrates fixed to the supports, especially in the initial more delicate phases of pattern transfer and subsequent selective galvanic growth of the conductive paths on the substrate. The technique is not usable if the substrates are studded with holes. In photolithographic operations it is mandatory to use the holes as datum points for aligning masks with the substrate, giving rise to problems related to the mechanical precision with which the holes are located and the much higher optical precision of photolithography.

One way of avoiding the aforementioned drawbacks is, for example, the one set forth in Italian patent application filed 19 Mar. 1986 under number 19803-A/86 in which is claimed a process for making metallized holes in a substrate with conductive and resistive paths characterized in that it comprises in succession the following phases: drilling of a flat substrate with conductive and resistive paths; repeated washing, first coarse and then fine, of the drilled substrate to remove drilling debris and preparation of the circuit for the following treatment; drying of the circuit; deposition of a substance capable of aiding adhesion over the entire surface of the two faces of the metallized substrate; another drying of the circuit; chemical deposition of a thin layer of copper over the entire surface of the two faces of the substrate; another drying of the circuit; masking of the two faces of the substrate excepting the holes and the immediately adjacent areas; galvanic growth of copper in the areas not masked; removal of masking; chemical removal of the copper from the previously masked areas of the substrate.

The main drawback of this process is that it requires numerous processing steps of chemical and electrogalvanic deposition to metallize the walls of the holes. Furthermore adherence of the metallization inside the hole is not optimal.

Another known process is the one described in the article by R.J. Thompson, B.W. Whitaker "Conductive via processing utilizing RF sputtering and selective electro deposition for hybrid thin film circuits", Proceedings 1982 of the 32nd Electronic Components Conference, San Diego, Calif. According to the aforementioned process, the metal layers are deposited only on the front of the substrate and drilling is performed when the operations necessary for obtaining the thin film hybrid circuit have been completed only for this side. Conductive connection through the holes is secured during deposition of the metal layers on the back of the substrate. However, thicker layers than those normally needed must be deposited.

Furthermore the hole walls must be perfectly vertical and lastly special procedures must be used in the deposition system to assure that the metals deposited from the back reach during deposition the metallizations of the front which face the edge of the hole. It is inconceivable to deposit metal layers on the front also because the existing circuit would have to be protected in some way.

Therefore, the object of the present invention is to overcome the aforementioned drawbacks, especially those inherent in the process described in the aforementioned article, and provide a process for making conducting connections in dielectric substrates by the vacuum deposition of metals on the surface and inside the through holes, the principal feature of which is the creation of conductive rivets protruding beyond the edge of the holes on the front of the substrate.

SUMMARY OF THE INVENTION

The specific object of the present invention is to provide a process for the making of metallized holes in a dielectric substrate, wherein rivets assure that the metal layers deposited on the back and inside the holes reach the front with ease, are welded with the rivets and thus assure electrical connection between the two sides of the holes even when the walls and edges of the holes are not perfect.

The fundamental presence of the protruding rivets avoids the necessity of making thick metal vacuum deposits and using equipment with sophisticated movements to make the connections with the conducting paths on the front.

The drilling phase follows the initial phase of deposition of uniform metal layers and galvanic growth of the conducting paths on the front of the substrate. This is an advantage for the following motives: The substrate can be used for different type of circuits. Furthermore the galvanic growth phase is the most delicate and determines the accuracy of transfer of the image in the photolithography phase and its spatial location on the substrate. As this phase is performed without holes, the above mentioned drawbacks are avoided as regards the difficulty of using suction and vacuum creation techniques to hold the substrates on the supports and it is possible to secure greater precision of the relative positions of the holes and the conductive paths on the circuit since alignment of the mask on the substrate is no longer affected by the holes.

Other objects and advantages of the present invention will become clear from the following detailed description given as a preferred embodiment of the process which is the object of the invention and the main phases of which are illustrated in FIGS. 1 to 8 of the annexed drawings described below.

DESCRIPTION OF THE PREFERRED EMBODIMENT

Figure 1:
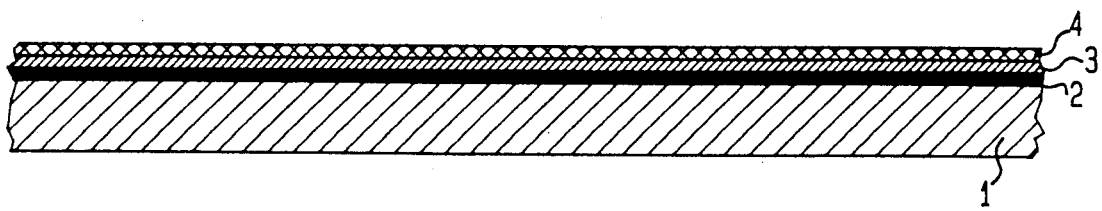

With reference to FIG. 1 a flat substrate 1 of, for example, alumina or other material used typically as the substrate in thin film microelectroic technology, is covered on the front with a single or double layer of resistive metal 2, e.g. tantalum or compounds thereof with nitrogen and oxygen, followed by a metal adhesion layer 3, e.g. of titanium, and by a conductive layer 4, e.g. of palladium.

The aforementioned layers are deposited in a vacuum chamber by one of the processes of the art known by the acronym PVD (Physical Vapor Deposition), e.g. the process described in U.S. Pat. No. 4226932 granted 7 Oct. 1980.

On the back of the substrate no deposition is made.

There is thus obtained a product which can be stored as a semifinished product.

The semifinished product is then taken from storage and sent to further processing, e.g. to secure a thin film hybrid having certain conductive and/or resistive paths in accordance with the known prior art.

Figure 2:
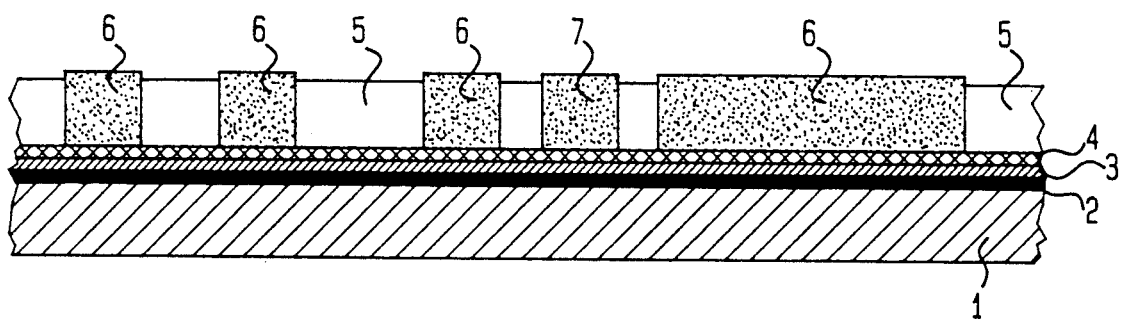

With reference to FIG. 2 the conductive layer 4 is first covered with a lacquer 5 which is photosensitive to ultraviolet radiation, hereinafter called photoresist. It is then exposed with a mask, not shown in the figure, which reproduces the paths it is wished to create, developed and grown electrogalvanically with a conducting metal 6, e.g. gold, in the zones where the photoresist was removed during development. Either negative or positive photoresist may be used.

The growth of conducting metal, indicated by the numeral 7 in the figure, is also performed as a datum point allowing perfect centering of the holes it is intended to make in the circuit.

Figure 3:
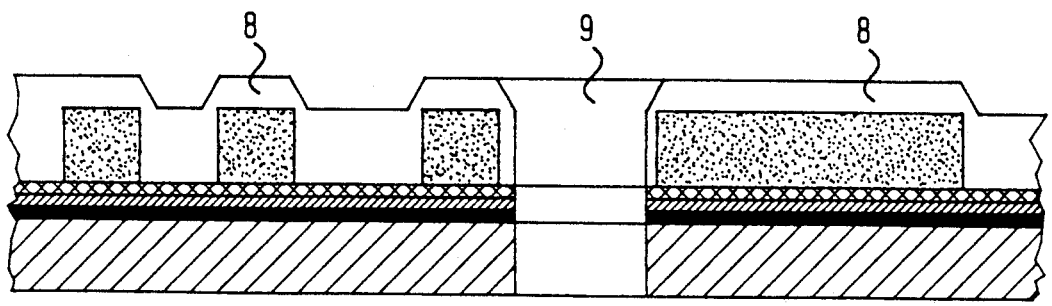

With reference to FIG. 3, after the growth phase the photoresist 5 is removed chemically or in plasma and the front is covered with a protective lacquer 8 and then drilled (e.g. by ultrasonic drill, laser, diamont-tipped milling cutter), securing through holes such as those indicated by reference numeral 9.

The cross section of the holes may be of any form, e.g. round or elliptical, rectangular, etc.

The protective lacquer 8 prevents deposition of processing residue and damage to the metals, especially those in the zones surrounding the hole edges, during drilling, which must be very accurate and precise.

The protective lacquer 8 is then removed chemically and the product thus obtained is ready for the subsequent operations which will provide conductive metallization passing through the holes and recesses in accordance with the process described below which is the object of the present invention.

Figure 4:
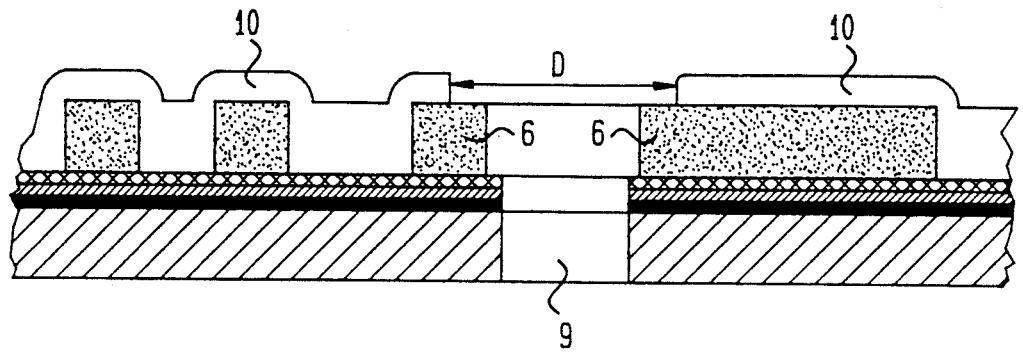

With reference to FIG. 4 a cover is made with negative photoresist 10 which is then exposed with an appropriate mask, not shown in the figure, in such a manner that after development there remain rings of the metal 6 deposited on the front and coinciding with the holes. The letter D indicates the diameter of a ring made in the photoresist 10.

The need to use a negative photoresist is dictated by the assurance that this type of photoresist can be completely removed from the inside of the hole by using the appropriate mask for exposure so that the ring is completely free from residual photoresist.

In the next phase metal is grown galvanically in the zone unprotected by the photoresist 10, being careful to superimpose it on the metal 6 already deposited.

Figure 5:
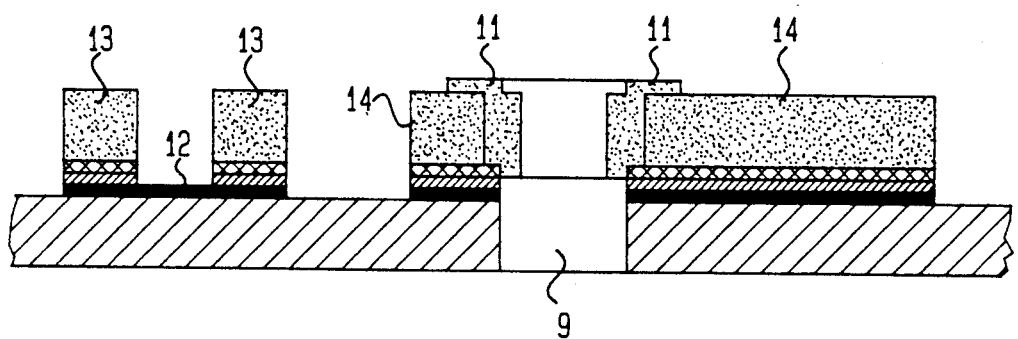

A metal rivet 11 is thus generated as shown in FIG. 5 which protrudes toward the interior of the hole 9 because there is no photoresist to restrict its growth. Consequently the diameter of the hole is slightly reduced (by a few microns), where it coincides with the rivet, to approximately double the thickness of the grown metal. This protruding rivet assures securing reliably through the hole conductive connection with the back of the substrate.

The negative photoresist 10 is then removed chemically and the conductive and resistive paths of the front are completed in accordance with the known art, e.g. described in Italian patent application no. 21126-A/86 filed 15 July 1986 in which there is claimed a process for creating passive thin film circuits with resistive lines with different resistive layers formed by superimposing an upper layer with less resistivity on a lower layer with higher resistivity characterized in that it uses for the lower layer tantalium treated with a first dopant and for the upper layer titanium treated with a second dopant.

In this manner there is secured the result shown schematically in FIG. 5 in which are shown a resistor 12 with its contacts 13, a conductive line 14 which connects the rivet 11.

Figure 6:
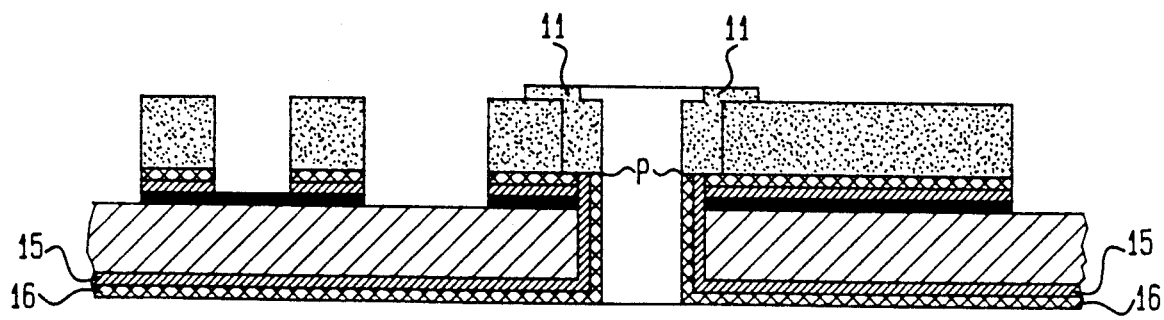

The substrate is brought back to the vacuum chamber and, as shown in FIG. 6, there are deposited on the back, using the PVD technique, an adhesion layer 15, e.g. of titanium, and a conduction layer 16, e.g. of palladium. Said layers also spread over the side walls of the hole until they meet at P the protrusion of the rivet 11 to form a reliable conductive contact on the front.

The fundamental presence of the protruding rivet obviates the vacuum deposition of thick metal and the use of equipment with sophisticated movements to form the connections with the conductive paths of the front.

The substrate is then removed from the vacuum chamber and the phase described in connection with FIG. 4 is repeated, i.e. deposition of negative photoresist, exposure with the same mask as in FIG. 4, development and galvanic growth of metal.

Figure 7:
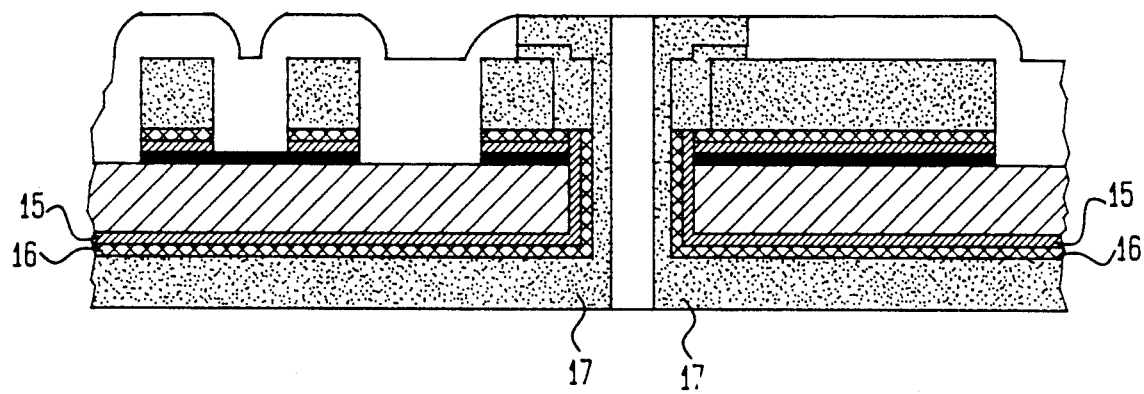

As shown in FIG. 7, in this case the metal 17 also grows over the entire back side and inside the hole, these being conductive surfaces covered by the conduction layer 16, thus completing the ground plane on the back of the hybrid thin film circuit and providing a reliable conductive connection through the hole or recess in addition to perfect adherence of the metallization to the walls of the hole.

Figure 8:
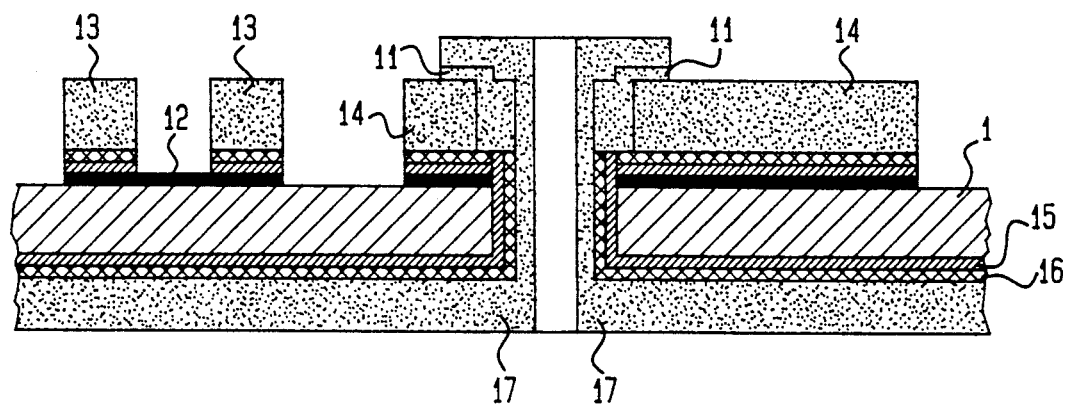

Thus, by removing the negative photoresist 10 there is obtained the finished circuit or product as shown in FIG. 8 where the reference numerals indicate the same components as described above.

When the circuit also calls for unmetallized holes, they can be provided at the end of processing by a standard drilling and cutting process in accordance with the known art.

It is apparent that numerous variants of the novel process described herein are possible without exceeding the scope of the principles of the invention, the scope of which is limited only by the claims appended hereto.

For example in the phase described with reference to FIG. 7 it would be possible to deposit on the back negative photoresist and expose it with an appropriate mask in such a manner as to obtain a conductive path or particular integrated conductive forms on the back of the substrate.

Variants are also possible in the type of conducting metal used to grow the layer 16 (FIG. 7), e.g. copper or silver. For the layer 17 (FIG. 7), combinations of copper, nickel or gold layers could be used.

We claim:

1. A process for forming metallized holes in a dielectric substrate having conductive and/or resistive paths on one side, hereinafter called the front, the other side being called hereinafter the back, comprising the following steps in succession:
   (a) electrogalvanic growth of the conductive and/or resistive paths delimited by a first photosensitive lacquer on said front,
   (b) drilling of the substrate and forming of holes,
   (c) covering of the front with a second negative photosensitive lacquer and exposing said second negative photosensitive lacquer with a mask and developing it to form uncovered rings of said conductive and/or resistive paths coinciding with the holes,
   (d) electrogalvanic growth of metal on the front and forming of metal rivets protruding inside the holes as extensions of said conductive and/or resistive paths,
   (e) removal of said second photosensitive lacquer and completing of conductive and/or resistive paths,
   (f) deposition on the back of metals which also spread over the side walls of said holes until they unite electrically with the protrusions of said metal rivets,
   (g) covering of the front with said second photosensitive lacquer and development with said mask, and
   (h) electrogalvanic growth of metal on the back, side walls of the holes and the front in the zones not covered by said second photosensitive lacquer.

2. A process in accordance with claim 1 wherein between steps (a) and (b) said first photosensitive lacquer is removed and said front is covered with a protective lacquer which is then removed after said drilling step (b).

3. A process in accordance with claim 1 wherein in step (f) said deposition on the back is done in a vacuum and said metals constitute a first adhesion layer followed by a first conduction layer.

4. A process in accordance with claim 1 wherein after step (h) said second photosensitive lacquer is removed.

5. A process in accordance with claim 3 wherein step (a) is preceded by a vacuum deposition step on said front of the substrate of metals which form a first resistive layer followed by a second adhesion layer and by a second conduction layer.

6. A process in accordance with claim 5 wherein said first resistive layer is formed of tantalum or its compounds with nitrogen and oxygen.

7. A process in accordance with claim 3 wherein said first and second adhesion layers consist of titanium.

8. A process in accordance with claim 3 said first and second conduction layers consist of palladium.

9. A process in accordance with claim 5 wherein said first resistive layer is single or double.

10. A process in accordance with claim 1 wherein said first photoresistive lacquer is positive.

11. A process in accordance with claim 1 wherein said first photosensitive lacquer is negative.

12. A process in accordance with claim 1 wherein said dielectric substrate is alumina.

13. A process in accordance with claim 5 wherein said first and second adhesion layers consist of titanium.

14. A process in accordance with claim 5 wherein said first and second conduction layers consist of palladium.

* * * * *